United States Patent
Wu

(10) Patent No.: US 10,404,282 B2
(45) Date of Patent: Sep. 3, 2019

(54) APPARATUSES AND METHODS FOR INTEGRATED INTERLEAVED REED-SOLOMON ENCODING AND DECODING

(71) Applicant: Micron Technology, Inc., Boise, ID (US)

(72) Inventor: Yingquan Wu, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 15/221,806

(22) Filed: Jul. 28, 2016

(65) Prior Publication Data
US 2018/0034480 A1  Feb. 1, 2018

(51) Int. Cl.
*H03M 13/15* (2006.01)
*H03M 13/29* (2006.01)
*H03M 13/37* (2006.01)

(52) U.S. Cl.
CPC ..... *H03M 13/1515* (2013.01); *H03M 13/293* (2013.01); *H03M 13/2909* (2013.01); *H03M 13/2948* (2013.01); *H03M 13/373* (2013.01); *H03M 13/3761* (2013.01)

(58) Field of Classification Search
CPC ............. H03M 13/15; H03M 13/1515; H03M 13/3761; H03M 13/373; H03M 13/293; H03M 13/2909; H03M 13/2948
See application file for complete search history.

(56) References Cited

U.S. PATENT DOCUMENTS

| | | | |
|---|---|---|---|
| 5,946,328 A * | 8/1999 | Cox | G11B 20/1833 |
| | | | 714/756 |
| 8,161,360 B1 * | 4/2012 | Wu | H03M 13/2903 |
| | | | 714/767 |
| 8,433,979 B2 * | 4/2013 | Blaum | G06F 11/108 |
| | | | 714/770 |
| 9,077,378 B2 * | 7/2015 | Wu | H03M 13/2942 |
| 2005/0278610 A1 * | 12/2005 | Banks | H03M 13/1515 |
| | | | 714/784 |

OTHER PUBLICATIONS

Y. Wu, "A new encoding method for integrated-interleaved codes," in Proc. IEEE Int. Symp. Inf. Theory, Austin, TX, USA, Jun. 2010, pp. 983-987.*
Y. Wu, "A new encoding method for integrated-interleaved codes," in Proc. IEEE Int. Symp. Inf. Theory, Austin, TX, USA, Jun. 2010, pp. 983-987 (Year: 2010).*
Blaum, et al. "Partial-MDS Codes and Their Application to RAID Type of Architectures", IEEE Transactions on Information Theory, vol. 59, No. 7, Jul. 2013, pp. 4510-4519.
Abdel-Ghaffar, et al. "Multilevel Error-Control Codes for Data Storage Channels", IEEE Transactions on Information Theory, vol. 37, No. 3, May 1991, pp. 735-741.

(Continued)

*Primary Examiner* — April Y Blair
*Assistant Examiner* — Rong Tang
(74) *Attorney, Agent, or Firm* — Brooks, Cameron & Huebsch, PLLC

(57) ABSTRACT

One example of integrated interleaved Reed-Solomon decoding can include computing a number of syndromes for each of a number of interleaves and correcting a number of erasures in each of the number of interleaves.

26 Claims, 4 Drawing Sheets

(56) References Cited

OTHER PUBLICATIONS

Hassner, et al. "Integrated Interleaving—A Novel ECC Architecture", IEEE Transactions on Magnetics, vol. 37, No. 2, Mar. 2001, pp. 773-775.

Tang, et al. "A Novel Method for Combining Algebraic Decoding and Iterative Processing", IEEE International Symposium on Information Theory, Seattle, WA, USA, Jul. 2006, pp. 474-478.

Blaum, et al. "Generalized Concatenated Types of Codes for Erasure Correction", <http://arxiv.org/abs/1406.6270>, San Jose, CA, USA, Jul. 11, 2014, 28 pp.

Tang, et al. "On the Performance of Integrated Interleaving Coding Schemes", IEEE International Symposium on the Information Theory, Chicago, IL, USA, 2002, pp. 267-271.

Maucher, et al. "On the Equivalence of Generalized Concatenated Codes and Generalized Error Location Codes", IEEE Transaction on Information Theory, vol. 46, No. 2, Mar. 2000, pp. 642-649.

McEliece, et al. "On the Decoder Error Probability for Reed-Solomon Codes". IEEE Transactions on Information Theory, vol. 32, No. 5, Sep. 1986, pp. 701-703.

Wu "New List Decoding Algorithms for Reed-Solomon and BCH Codes", IEEE Transactions on the Information Theory, vol. 54, No. 8, Aug. 2008, 3611-3630.

\* cited by examiner

|  | 352-1 | 352-2 | 352-3 | 352-4 | 352-5 | 352-6 | 352-7 | 352-8 | 352-9 | 352-10 | 352-11 | 352-12 | 352-13 | 352-14 | 352-15 | 352-16 |
|---|---|---|---|---|---|---|---|---|---|---|---|---|---|---|---|---|
| 350-1 | D | D | D | D | D | D | D | D | D | D | D | D | D | D | P | P |
| 350-2 | D | D | D | D | D | D | D | D | D | D | D | D | D | D | P | P |
| 350-3 | D | D | D | D | D | D | D | D | D | D | D | D | D | P | P | P |
| 350-4 | D | D | D | D | D | D | D | D | D | D | D | D | D | D | D | P |
| 350-5 | D | D | D | D | D | D | D | D | D | D | D | D | D | D | D | P |
| 350-6 | D | D | D | D | D | D | D | D | D | D | D | D | D | D | D | P |
| 350-7 | D | D | D | D | D | D | D | D | D | D | D | D | D | D | D | P |
| 350-8 | D | D | D | D | D | D | D | D | D | D | D | D | D | D | D | P |

*Fig. 3*

APPARATUSES AND METHODS FOR INTEGRATED INTERLEAVED REED-SOLOMON ENCODING AND DECODING

TECHNICAL FIELD

The present disclosure relates generally to semiconductor memory and methods, and more particularly, to apparatuses and methods related to integrated interleaved (II) Reed-Solomon encoding and decoding.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error information, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in portable electronic devices, such as laptop computers, portable memory sticks, digital cameras, cellular telephones, portable music players such as MP3 players, movie players, and other electronic devices. Memory cells can be arranged into arrays, with the arrays being used in memory devices.

To ensure data integrity, error correction codes can be used to detect and correct certain numbers and/or types of errors in the data. One type of error correction involves integrated interleaved codes. Integrated interleaved codes can be systematic codes (i.e., input data is included or otherwise embedded in the encoded data) and can generate multiple codewords, each of which can be at a particular layer. Powerful error correction may be desired but balanced against latency, throughput, and/or power constraints such as those imposed by portable electronic devices.

BRIEF DESCRIPTION OF THE DRAWINGS

FIG. 3 illustrates a RAID architecture based on generalized integrated interleaving of Reed-Solomon codes in accordance with a number of embodiments of the present disclosure.

DETAILED DESCRIPTION

Figure 1:
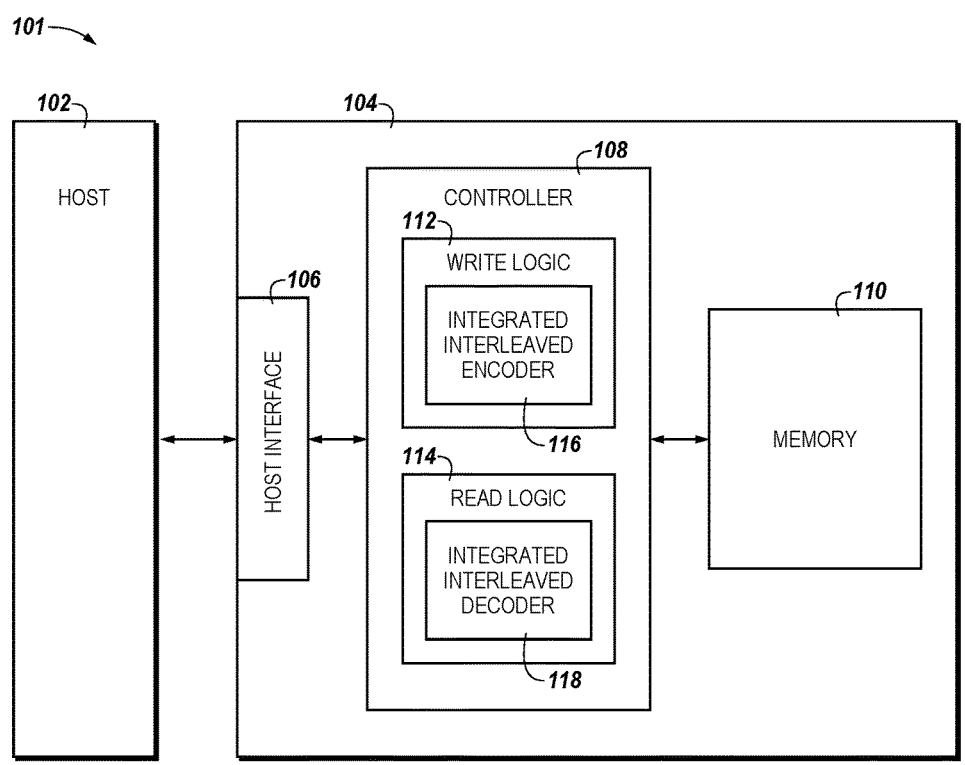
FIG. 1 is a block diagram of a system in accordance with a number of embodiments of the present disclosure.

The present disclosure includes apparatuses and methods related to integrated interleaved (II) Reed-Solomon encoding and decoding. A number of methods can include independently correcting a number of erasures in each of the number of interleaves and in response to unsuccessfully correcting the number of erasures in each of the number of interleaves: computing a number of corrupted nested interleaves, computing a number of higher order syndromes for each of the number of corrupted nested interleaves, and correcting a number of erasures in each of the corrupted nested interleaves.

A number of methods can include systematically encoding data corresponding to first-layer interleaves using a first generator polynomial, computing a number of messages corresponding to the number of first-layer interleaves, systematically encoding the messages using a second generator, and computing parity. The messages can be at least partially based on a first truncated portion of the data. The parity can be at least partially based on a second truncated portion of the data.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 220 may reference element "20" in FIG. 2, and a similar element may be referenced as 420 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of a system 101 in accordance with a number of embodiments of the present disclosure. In this example, the computing system 101 includes a host 102 and a memory device 104. The memory device 104 can include a host interface 106, a controller 108, and a memory 110. As used herein, host 102, memory device 104, and controller 108 might separately be considered an "apparatus."

The host 102 can be coupled (e.g., connected) to memory device 104, which includes the memory 110. Host 102 can be a host system such as a personal laptop computer, a desktop computer, a digital camera, a smart phone, or a memory card reader, among various other types of hosts. Host 102 can include a system motherboard and/or backplane and can include a number of processing resources (e.g., one or more processors, microprocessors, or some other type of controlling circuitry). The system 101 can include separate integrated circuits or both the host 102 and the memory device 104 can be on the same integrated circuit. The system 101 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 101 has been simplified to focus on features with particular relevance to the present disclosure. The memory 110 can include a number of arrays such as a hybrid memory cube (HMC), processing in memory random access memory (PIMRAM) array, DRAM array, SRAM array, STT RAM array, PCRAM array, TRAM array, RRAM array, NAND flash array, and/or NOR flash array, for instance. The memory 110 can comprise memory cells arranged in rows coupled by access lines (which may be referred to herein as word lines or select lines) and columns coupled by sense lines. The memory 110 may include a plurality of arrays (e.g., a plurality of banks of DRAM cells).

The controller 108 can be coupled to the host interface 106 and to the memory 110 via a plurality of channels (not shown) and can be used to transfer data between the memory system 104 and a host 102. As described herein, the memory 110 can comprise a redundant array of independent disks (RAID). When the independent disks are NAND flash memory, a RAID can be referred to as a redundant array of NAND (RAIN). The host interface 106 can be in the form of a standardized interface. For example, when the memory system 104 is used for data storage in a computing system 101, the host interface 106 can be a serial advanced technology attachment (SATA), peripheral component interconnect express (PCIe), or a universal serial bus (USB), among other connectors and interfaces. In general, however, the host interface 106 can provide an interface for passing control, address, data, and other signals between the memory system 104 and a host 102 having compatible receptors for the host interface 106.

The controller 108 can include write logic 112 and read logic 114. Controller 108 can cause data to be written to memory 110 and/or additional memory locations and can cause data to be read back from the memory 110. Prior to storing data in the memory 110, data can be encoded using an integrated interleaved encoder 116. Data read from the memory 110 can be decoded using an integrated interleaved decoder 118. In some examples, a read back from the memory 110 can have noise or errors in the data and using an integrated interleaved code can allow the read-back errors to be corrected.

Figure 2:
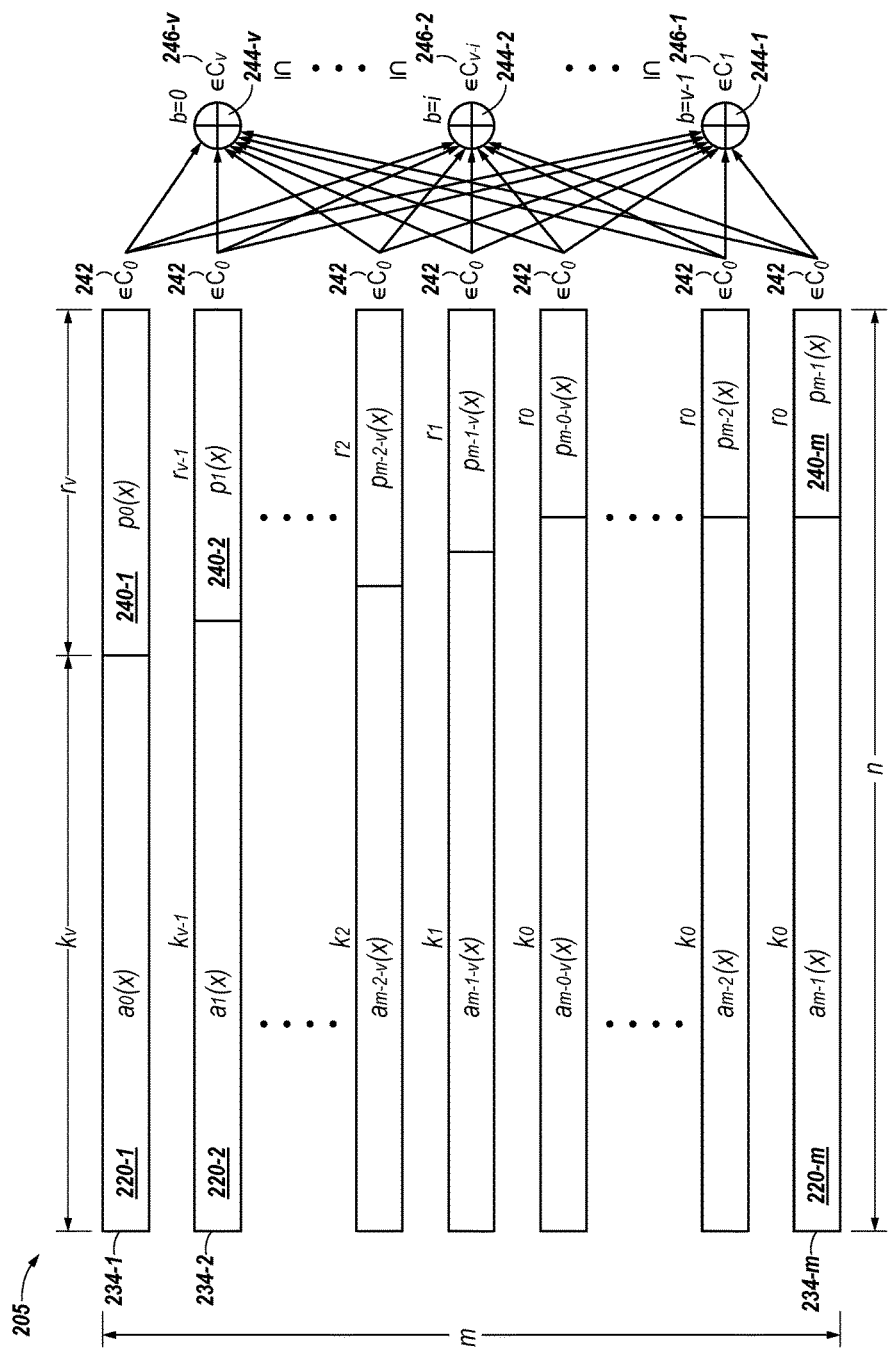
FIG. 2 illustrates an example of a diagram for generalized integrated interleaving in accordance with a number of embodiments of the present disclosure.

To achieve better error protection over an array of interleaves within a single cluster or block of data, a two-layer interleaved scheme can be used and a generalized interleaved scheme can provide nonuniform redundancy. An array of interleaves refers to data arranged in a noncontiguous manner. Interleaving can refer to dividing memory into small chunks and used as a high-layer technique to solve memory issues for motherboards and chips. In this way, interleaving can control errors with particular algorithms. The nonuniform redundancy is provided by using extra check symbols that are shared among all the interleaves and used by interleaves with errors beyond their decoding distance. However, this construction does not provide protection to the shared redundancies. Instead, another code is required to protect these shared check symbols from errors. The integrated interleaving (II) coding scheme provides an improvement by creating shared redundancy that is protected by the first-layer code. Specifically, the II coding scheme nests a set of m equally protected interleaves with v(v<m) more powerful codewords in the nested layer which is a subcode of the first layer. Specifically, let $\{C_i(n, k_i, d_i)\}_{i=0}^{1}$ be defined over the Galois field GF(q) such that $C_1 \subset C_0$. An II code can be defined as follows:

$$\mathcal{C} \triangleq \left\{ c = [c_0, c_1, c_2, \ldots, c_{m-1}]: c_i \in \mathcal{C}_0, \sum_{i=0}^{m-1} a^{bi} c_i \in \mathcal{C}_1, 0 \le b < v \right\}, \quad (1)$$

where v<m≤q and α is a primitive element of GF(q). The above defined II coding scheme allows for more powerful correction among any v interleaves that are otherwise failed by self-decoding. As used herein, self-decoding refers to stand-alone decoding of an interleave without resorting to nesting information, for example, as illustrated in FIG. 2. An algebraic systematic encoding method for a special class of II codes where v=1 can be described. General two-layer II codes where v≥1 can be characterized such that a non-systematic encoding algorithm as well as an algebraic decoding algorithm can be derived.

FIG. 2 illustrates an example of a diagram 205 for generalized integrated interleaving of Reed-Solomon codes in accordance with a number of embodiments of the present disclosure. As illustrated in FIG. 2, a two-layer II coding scheme can be generalized to allow unequal protection in the nested layer. FIG. 2 illustrates m component codewords 234-1 to 234-m (herein referred to in combination as codewords 234). Each of the m component codewords 234 has length n such that the codewords 234 are sets of m×n matrices. Each of the m component codewords 234 comprise a corresponding data polynomial $\alpha_0(x)$ 220-1 to $\alpha_{m-1}(x)$ 220-m of length $k_v$ and a corresponding parity polynomial $p_0(x)$ 240-1 to $p_{m-1}(x)$ 240-m of length $r_v$ such that $k_v + r_v = n$, where v is a number of layers in the GII-RS code. A data polynomial refers to user data that is encoded in the codeword. A parity polynomial refers to parity that is encoded in the codeword. As illustrated in FIG. 2, length $k_v$ and length $r_v$ can vary with each of the m component codewords 234. For example, compare codeword 234-1 to codeword 234-2.

The m component codewords 234 can comprise a first-layer codeword $C_0$ 242. As used herein, a component codeword may also be referred to as an interleave. Thus, m interleaves 234 (e.g., m codewords 234) can be nested into a single II codeword (e.g., the first layer codeword $C_0$ 242. The m component codewords of the first-layer codeword $C_0$ 242 can be integrated into interleaves to form higher-layer codewords 246. As illustrated in FIG. 2, the m component codewords of the first-layer codeword $C_0$ 242-1 can be combined by adder 244-1 to form a second-layer codeword $C_1$ 246-1. The process can be repeated to form additional higher-layer codewords 246 including the first-layer codeword $C_0$ 242, the second-layer codeword $C_1$ 246-1, up to a with-layer codeword $C_v$ 246-v corresponding to v interleaves. As illustrated in FIG. 2, each subsequent higher-layer codeword 246 comprises the combination of m component codewords 234 formed by the corresponding v-1th-layer adders 244-1 to 244-v as well as the preceding higher-layer codeword 246. With each subsequent higher-layer codeword 246, another layer of redundancy, and thereby another layer of protection, is added.

Let $\{C_i(n, k_i, d_i)\}_{i=0}^v$ be over the Galois field GF(q) such that $$C_v \subseteq C_{v-1} \subseteq C_{v-2} \subseteq \ldots \subseteq C_1 \subset C_0. \quad (2)$$

A generalized integrated interleaved (GII) code is defined as $$\mathcal{C} \triangleq \quad (3)$$

$$\left\{ c = [c_0, c_1, c_2, \ldots, c_{m-1}]: c_i \in \mathcal{C}_0, \sum_{i=0}^{m-1} \alpha^{bi} c_i \in \mathcal{C}_{v-b}, 0 \le b < v \right\},$$

where v<m≤q. Note that the above definition is different from previous approaches where a GII code may be defined as $$\mathcal{C} \triangleq \quad (4)$$

$$\left\{ c = [c_0, c_1, c_2, \ldots, c_{m-1}]: c_i \in \mathcal{C}_0, \sum_{i=0}^{m-1} \alpha^{bi} c_i \in \mathcal{C}_{b+1}, 0 \le b < v \right\}.$$

One difference lies in that the parameter b corresponds to a different subcode. As described below, the definition in (3) yields simpler implementation for both encoding and decoding as compared to prior approaches.

Generalized integrated interleaved Reed-Solomon (GII-RS) codes, as described above, may be given in terms of a parity check matrix. The parity check matrix may be dynamically transformed to an upper triangular form for each decoding attempt. However, at least one embodiment in accordance with the present disclosure includes a decoder that does not directly involve the parity check matrix. In some approaches, all syndromes are computed at the beginning and repeatedly updated during decoding. However, at least one embodiment in accordance with the present disclosure includes computing higher order syndromes of uncorrectable interleaves from the de-mapping of nested syndromes during decoding. In some other approaches, an encoder may be an erasure-only decoder. However, at least one embodiment in accordance with the present disclosure includes a linear-feedback-shift-register.

It is instrumental to compare the GII coding scheme with a generalized concatenated (GC) framework. The GII coding scheme is similar to the GC coding scheme in view of theoretical performance and shared redundancies on top of the first layer self-correction. A difference and benefit of GIL codes is that their shared redundancies are also embedded in, and thus protected by, the first-layer interleaves, whereas for GC codes, the shared redundancies are not. As described above, nested layer codes may form a subcode order and may be subcodes of the first-layer code in GII codes, whereas the inner (but not outer) codes forms a subcode order and are used to encode each symbol of the outer codes in GC codes. The nested layer codes and the first-layer code may share the same field and code length in GII codes, however, the outer codes may be defined in a larger field and thus may have much larger length than the inner codes in GC codes. As a consequence, the implementation and architecture of GII codes is different from the schemes of the GC codes.

II coding schemes and GII coding schemes can be applied to an array of storage devices. Each storage device can contain one or more sectors, each of which can be protected by an error-correcting code. An error-correcting code can correct common errors in the storage devices. However, it may occur that one or more of the storage devices experiences a catastrophic failure where all the information in the that one or more of the storage devices is lost. For this reason, the architecture known as redundant arrays of independent disks (RAID) were proposed. RAID architectures work by assigning one or more storage devices to parity. For example, a RAID 5 architecture provides protection against a single catastrophic device failure within a stripe of disks. In contrast, a RAID 6 architecture gives protection against two catastrophic device failures. It is a rare scenario to have two catastrophic device failures occur nearly simultaneously. Therefore, the RAID 6 architecture may be wasteful by employing two parity disks. To this end, it can be beneficial to deploy an II-RS or a GII-RS code, such that each interleave of the II-RS or a GII-RS code is a RAID 5 architecture, which can allow a fraction of stripes to have two or more catastrophic device failures.

GII-RS codes may be compared with another RAID alternative based on partial maximum distance separable (PMDS) codes. A PMDS coding scheme, under proper parameters, may be more powerful than a GII-RS coding scheme, but parameters of a PMDS coding scheme are not as flexible as a GII-RS coding scheme. For instance, to add three parity disks to a set of RAID 5 stripes, a GII-RS coding sheme can recover three stripes with two catastrophic device failures, or, one stripe with two catastrophic device failures and one with three catastrophic device failures, depending on the parameters of the GII-RS coding scheme. In contrast, a PMDS coding scheme may recover both cases for a subset of stripe numbers and lengths. In addition, a GII-RS coding scheme can operate in a smaller field and can have simpler encoding and decoding implementations than a PMDS coding scheme.

FIG. 3 illustrates a RAID design based on generalized integrated interleaving of Reed-Solomon codes in accordance with a number of embodiments of the present disclosure. In the example of FIG. 3, each interleave is composed of sixteen memory devices 352-1 to 352-16 (e.g., sixteen independent disks), where each interleave can independently recover a single catastrophic device failure. FIG. 3 illustrates eight interleaves 350-1 to 350-8. In FIG. 3, "D" indicates an interleave of an memory device assigned to data and "P" indicates an interleave of an insdependent disk assigned to parity. Among the eigth interleaves 350-1 to 350-8, up to two interleaves with two catastrophic device failures (e.g., interleaves 350-1 and 350-2) and up to one interleaves with three catastrophic device failures (e.g., interleave 350-3) can be recovered. The GII-RS coding scheme in FIG. 3 uses 1.5 redundant memory devices per interleave, while being capable of recovering from the rare scenario of two simultaneous catastrophic device failures. Furthermore, the GII- RS coding scheme in FIG. 3 is capable of recovering from the even more rare scenario of three simultaneous catastrophic device failures.

Although FIG. 3 illustrates an example RAID architecture having sixteen memory devices where each of the memory devices comprise eight interleaves, embodiments are not so limited. Embodiments can include at least two memory devices where the at least two memory devices comprise at least two interleaves.

A two-layer II-RS coding scheme can be described as follows. Let $\{C_i(n, k_i, d_i)\}_{i=0}^{1}$ be Reed-Solomon (RS) codes over the Galois field GF(q) such that $C_1 \subset C_0$ and $d_1 > d_0$. Denote by $$r_i \triangleq n - k_i,$$

and $\alpha$ a primitive element of GF(q). A codeword vector c and its corresponding polynomial c(x) is not distinguished. The II-RS code (with $C_0$, $C_1$ being RS codes), denoted by II([m, v], n, [$d_0$, $d_1$]), is stated below.

Theorem 1 The II-RS code II([m, v], n, [$d_0$, $d_1$]) defined in (1) is a linear block code over GF(q) of length mn, dimension $(m-v)k_0 + vk_1$, and minimum distance min$\{(v+1)d_0, d_1\}$ In some approaches, an algebraic decoding may be significantly complicated by handling miscorrection at the first layer. By neglecting miscorrection for the self-decoding in the first layer and we consequently obtain the following less complicated result.

Theorem 2 The code C defined in (1) corrects up to $$\left\lfloor \frac{d_1 - 1}{2} \right\rfloor$$

errors for any v interleaves and up to $$\left\lfloor \frac{d_0 - 1}{2} \right\rfloor$$

errors for remaining m−v interleaves.

A nested layer is independent of an uncorrectable corrupted codeword location. Therefore, it can be beneficial to assign unequal correction capabilities in the nested layer such that the strongest correction capability is used to correct the most corrupted interleave while the weakest correction capability is used to correct the least corrupted interleave. This can be incorporated into GII coding scheme. The next theorem asserts basic properties of GII-RS codes, denoted by GII([m, v], n, [$d_0$, $d_1$, ..., $d_v$]).

Theorem 3 Let $\{C_i(n, k_i, d_i)\}_{i=0}^{v}$ be RS codes over the Galois field GF(q) such that $$C_0 \supset C_1 = \ldots = C_{i_1} \supset C_{i_1+1} = \ldots = C_{i_2} \supset \ldots = \\ C_{i_{s-1}} \supset C_{i_{s-1}+1} = \ldots = C_{i_s} \quad (5)$$

where $i_0 = 0$ and $i_s = v$. Let the GII-RS code, GII([m, v], n, [$d_0$, $d_1$, ..., $d_v$]), as described above, be defined where the minimum distance sequence [$d_0$, $d_1$, $d_v$] follows an increasing order. The GII-RS code C(N, K, $d_{min}$) is a linear block code over GF(q) of length N=mn, dimension $K = \sum_{i=1}^{v} k_i + (m-v)k_0$, and minimum distance:

$$d_{min} = \min\{(v+1)d_0, (v-i_1+1)d_{i_1}, \ldots, (v-i_{s-1}+1)d_{i_{s-1}}, d_v\}. \quad (6)$$

In the scenario where the nesting minimum distance sequence satisfies a strictly increasing order, $$d_0 < d_1 < d_2 < \ldots < d_v, \quad (7)$$

the minimum distance of a GII-RS code can be expressed in the following corollary.

Corollary 1 Let a GII-RS code GII([m, v], n, [$d_0$, $d_1$, ..., $d_v$]) be defined as in (3). If the nesting minimum distance sequence satisfies a strictly increasing order as in (7), then the code C exhibits a minimum distance of min$\{(v+1)d_0, vd_1, \ldots, 2d_{v-1}, d_v\}$.

Given a RS C(n, k) code, let c(x) denote a transmitted codeword polynomial and y(x) the received word polynomial where some terms have been erased while the remaining terms are error-free. The recovery process starts by computing syndrome values $$S_i \triangleq y(\alpha^i) = y(\alpha^i) - c(\alpha^i), i = 0, 1, 2, \ldots, r-1, \quad (8)$$

where erased locations are excluded from the computation. Let $\alpha_1, \alpha_2, \ldots, \alpha_e$ (e≤r) denote erasure locators, and $Y_1, Y_2, \ldots, Y_e$ denote the corresponding erased magnitudes. The erased magnitudes can be solved through the following linear equation system:

$$\begin{cases} Y_1 + Y_2 + \ldots + Y_e = S_0 \\ Y_1\alpha_1 + Y_2\alpha_2 + \ldots + Y_e\alpha_e = S_1 \\ Y_1\alpha_1^2 + Y_2\alpha_2^2 + \ldots + Y_e\alpha_e^2 = S_2 \\ \vdots \\ Y_1\alpha_1^{e-1} + Y_2\alpha_2^{e-1} + \ldots + Y_e\alpha_e^{e-1} = S_{e-1} \end{cases} \quad (9)$$

The solution yields $$\begin{bmatrix} Y_1 \\ Y_2 \\ Y_3 \\ \vdots \\ Y_e \end{bmatrix} = \begin{bmatrix} 1 & 1 & \ldots & 1 \\ \alpha_1 & \alpha_2 & \ldots & \alpha_e \\ \alpha_1^2 & \alpha_2^2 & & \alpha_e^2 \\ \vdots & \vdots & \ddots & \vdots \\ \alpha_1^{e-1} & \alpha_2^{e-1} & \ldots & \alpha_e^{e-1} \end{bmatrix}^{-1} \cdot \begin{bmatrix} S_0 \\ S_1 \\ S_2 \\ \vdots \\ S_{e-1} \end{bmatrix}. \quad (10)$$

Note that for given e≤r erasures, it suffices to compute the first e syndromes, $S_0, S_1, \ldots, S_{e-1}$, although there are r valid syndromes. On the other hand, when e>r, the erasures are not retrievable since there exist many valid solutions. As used herein, the term "erasure" refers to correcting an error whose location is known. An erasure is different than an "error" which, as used herein, refers to error whose location is not known. Correcting erasures may require about half of the amount of redundancy that is required to correct errors.

In a RAID artitechure, a larger set of erased values (from several memory devices) can be retrieved given the same erasure locations. Therefore, matrix inversion describe below can be pre-computed, which results in negligible computational cost.

An example decoding method in accordance with the present disclosure is as folows.

1. Input: $y(x) = [y_0(x), y_1(x), \ldots, y_{m-1}(x)]$, $\{\{\alpha_j^{(0)}\}_{j=1}^{e_0}, \{\alpha_j^{(1)}\}_{j=1}^{e_1}, \ldots, \{\alpha_j^{(m-1)}\}_{j=1}^{e_{m-1}}\}$.

2. Reorder the erasure count sequence $e_0, e_i, \ldots, e_{m-1}$ to a new sequence $\tau_0, \tau_1, \ldots, \tau_{m-1}$ such that $$\tau_{m-1} \leq \tau_{m-2} \leq \ldots \leq \tau_{v+1} \leq \tau_0 \leq \tau_1 \leq \ldots \tau_v. \tag{11}$$

If there exists $T_i > r_i$, $0 < v$, then declare an recovery failure.

3. Compute syndromes $\{S_j^{(i)}\}_{j=0}^{r-1}$, $i=0, 1, \ldots, m-1$, where $r=e_i$ if $e_i \leq r_0$, otherwise $r=r_0$.

4. Correct erasures, as described above, for interleaves that have up to $r_0$ erasures.

5. If the erasure corection is successful, then return the corrected codeword $c(x)=[c_0(x), c_1(x), \ldots, c_{m-1}(x)]$; else let the uncorrectable interleave indexes be $I=\{l_1, l_2, \ldots, l_b\}$.

6. Compute corrupted nested interleaves $$\tilde{y}_i(x) = \Sigma_{j \in I} \alpha^{ij} y_j(x) + \Sigma_{j \in I^c} \alpha^{ij} c_j(x) \tag{12}$$

for $i=0, 1, 2, \ldots, b-1$.

7. Compute higher order syndromes $\{\tilde{S}_j^{(i)}\}_{j=r_0}^{\tau_{v-1}-1}$ over each nested interleaves $\tilde{y}_i(x)$, $i=0, 1, \ldots, b-1$. Note that a different number of syndromes are computed over each nested interleave.

8. While $b>0$:

(a) Compute syndromes $\{S_j^{(l_i)}\}_{j=\tau_{v-b'}}^{\tau_{v-b}-1}$, $i=1, 2, \ldots, b$, through $$\begin{bmatrix} S_j^{(l_1)} \\ S_j^{(l_2)} \\ \vdots \\ S_j^{(l_b)} \end{bmatrix}_{j=\tau_{v-b'}}^{\tau_{v-b}-1} = \begin{bmatrix} 1 & 1 & \ldots & 1 \\ \alpha^{l_1} & \alpha^{l_2} & \ldots & \alpha^{l_b} \\ \vdots & \vdots & \ddots & \vdots \\ \alpha^{(b-1)l_1} & \alpha^{(b-1)l_2} & \ldots & \alpha^{(b-1)l_b} \end{bmatrix}^{-1} \begin{bmatrix} \tilde{S}_j^{(0)} \\ \tilde{S}_j^{(1)} \\ \vdots \\ \tilde{S}_j^{(b-1)} \end{bmatrix}_{j=\tau_{v-b'}}^{\tau_{v-b}-1} \tag{13}$$

where $\tau_{v-b}$ is initialized to $r_0$.

(b) Correct erasures through (10) for interleaves that have $\tau_{v-b}$ erasures.

(c) Let I' be the index set of newly corrected interleaves. Set $I \leftarrow I-I'$, $b' \leftarrow b$, and $b \leftarrow |I|$. If $I=\emptyset$ (all remaining interleaves have been corrected) then return the corrected codeword.

(d) Update higher order nested syndromes through $$\{\tilde{S}_j^{(l)}\}_{j=\tau_{v-b'}}^{\tau_{v-l}-1} \leftarrow \left\{\tilde{S}_j^{(l)} - \Sigma_{i \in I'} \alpha^{il} \sum_{z=1}^{s_i} Y_z^{(i)} (\alpha_z^{(i)})^j\right\}_{j=\tau_{v-b'}}^{\tau_{v-l}-1}, \tag{14}$$

$0 \leq l < b$.

Note in RAID recovery, the inverted matrix in (13) can be used many times for rebuilding entire disks; therefore, it can be beneficial to pre-compute the inverted matrix.

The decoding method described above can be compared to previous approaches. In previous approaches, decoding may dynamically transform a parity check matrix to an upper triangular shape (e.g., using Gaussian elimination). In contrast, at least one embodiment in accordance with the present disclosure does not. At least one embodiment in accordance with the present disclosure includes computing corrupted nested interleaves and computing higher order syndromes of uncorrectable interleaves through de-mapping, whereas previous approaches may not. In contrast to previous approaches, at least one embodiment in accordance with the present disclosure reduces erasure correcting capabilities to the actual erasure counts, thereby dynamically decreasing complexity.

The following theorem characterizes the decoding method described above. Its proof is omitted.

Theorem 4 Let $e_0, e_1, \ldots, e_{m-1}$ denote the number of erasures over received interleaves $y_0(x), y_1(x), \ldots, y_{m-1}(x)$, respectively. Let $\tau_0, \tau_1, \ldots, \tau_{m-1}$ be reordered erasure counts following (11). Then, the decoding is successful if $$\tau_i \leq r_i, i=0, 1, 2, \ldots, v. \tag{15}$$

Figure 4:
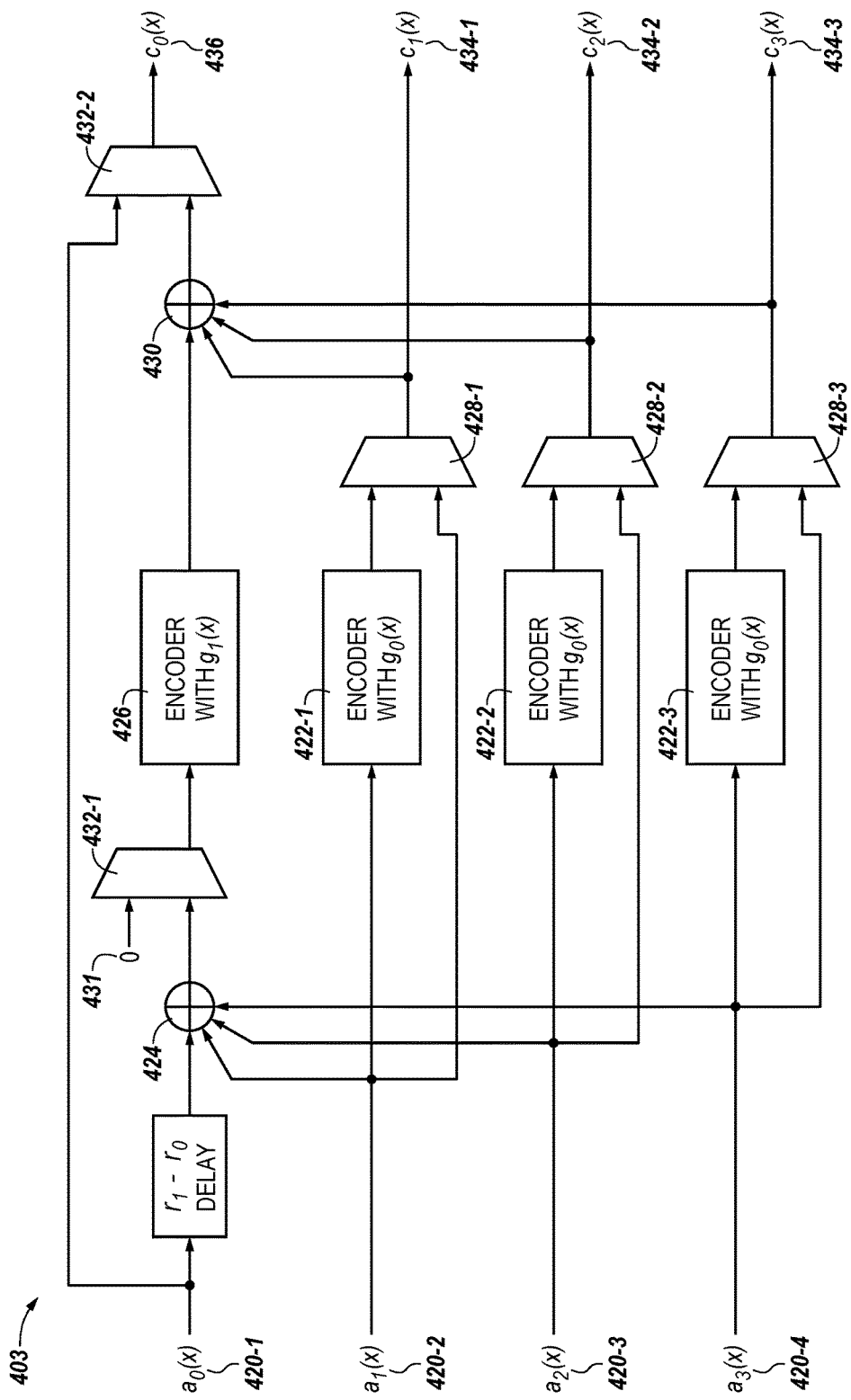
FIG. 4 illustrates an example of a diagram for integrated interleaved encoding in accordance with a number of embodiments of the present disclosure.

FIG. 4 illustrates an example of a diagram 403 for integrated interleaved encoding in accordance with a number of embodiments of the present disclosure. The diagram 403 includes a plurality of data polynomials such as $\alpha_0(x)$ 420-1, $\alpha_1(x)$ 420-2, $\alpha_2(x)$ 420-3, and $\alpha_3(x)$ 420-4 (herein referred to in combination as 420). The diagram 403 includes a plurality of encoders 422-1, 422-2, 422-3, and 426 (herein referred to in combination as encoder(s) 422 and 426, respectively), and a plurality of codewords such as $c_1(x)$ 434-1, $c_2(x)$ 434-2, and $c_3(x)$ 434-3, and $c_0(x)$ 436 (herein referred to in combination as codeword(s) 434 and 436, respectively). Encoders 422-1, 422-2, and 422-3 use a plurality of generator polynomials (e.g., $g_0(x)$ and $g_1(x)$) to encode the plurality of data polynomials 420. Cyclic codes, including RS and BCH codes, can be systematically encoded by a simple linear -feedback-shift-register (LFSR). For example, an LFSR encoder systematically encodes a data polynomial $\alpha(x)$ 420 to a systematic codeword $c(x)$ (e.g., codeword 434 or 436) through iteratively dividing—$x^r \alpha(x)$ by a generator polynomial $g(x)$. A systematic codeword is comprised of the original data polynomial $\alpha(x)$ 420 followed by its resulting remainder polynomial $p(x)$ (e.g., parity polynomial 240 in FIG. 2). Herein we denote the LFSR encoding by $$\varepsilon(a(x), g(x)) \to c(x) \triangleq [a(x), p(x)]. \tag{16}$$

A systematic codeword can be indexed in the reverse in a polynomial representation illustrated by $c=[c_{n-1}, c_{n-2}, \ldots, c_1, c_0]$.

In at least some embodiments, systematic encoding includes input data being embedded in encoded data (e.g., as codewords) and becomes output data. In at least some examples, input data can be in a beginning portion of a codeword. Redundant data (e.g., bits, bytes and/or symbols) can be added by systematically encoding using generator polynomials $g_0(x)$ and $g_1(x)$. As illustrated in FIG. 4, the encoders 422-1, 422-2, and 422-3 are configured to respectively input and systematically encode input data polynomials $\alpha_1(x)$ 420-2, $\alpha_2(x)$ 420-3, and $\alpha_3(x)$ 420-4 using $g_0(x)$. Codewords $c_1(x)$ 434-1, $c_2(x)$ 434-2, and $c_3(x)$ 434-3 are correspondingly output by systematic encoders 422-1, 422-2, and 422-3. To obtain the remaining codewords, a systematic encoding with respect to generator polynomial $g_1(x)$ is performed. Note that data polynomial $\alpha_0(x)$ 420-1 is shorter than data polynomials $\alpha_1(x)$ 420-2, $\alpha_2(x)$ 420-3, and $\alpha_3(x)$ 420-4 by $r_1-r_0$ bits. Thus, a $r_1-r_0$ delay 229 can be used to align the data polynomials $\alpha_0(x)$ 420-1 through $\alpha_3(x)$ 420-4 for the $k_0$ ending bits. Data polynomials $\alpha_0(x)$ 420-1 through $\alpha_3(x)$ 420-4 are correlated with the $r_1-r_0$ delay 229 and input to adder 424 which outputs a sum of the input. The sum in turn becomes input to a first multiplexer 432-1. Additional data, or padding, (e.g., "0") 431 is input into multiplexer 432-1 to delay the $g_1(x)$ encoding by $r_1-r_0$ clocks. Output data of the first multiplexer 432-1 becomes input data for encoder 426 which systematically encodes the sum using $g_1(x)$ and outputs an intermediate portion of data.

In at least one embodiment, data polynomial $\alpha_0(x)$ 420-1 is received by a second multiplexer 432-2 as a first input of data. A second input of data into the second multiplexer 432-2 is from adder 430. Adder 430 receives as input redundant data output from encoder 426, and inverted or negative redundant data that are output data from encoders 422-1, 422-2, and 422-3, respectively. A select signal (not illustrated) is configured to select an appropriate input at an appropriate time from each correponding encoder. Although some of the equations and/or descriptions are associated with a particular number of encoders and/or data inputs and outputs, embodiments are not so limited.

Systematic encoding methods of a coding scheme can be beneficial to practical applications. In previous approaches, a systematic encoding method has been devised for the special case v=1 (e.g., one integrated interleave). Decoding of GII codes can be straightforward but systematic encoding can be intricate. This is opposite to many other algebraic coding schemes.

To ease presentation, two operators are introduced. $\mathcal{L}_r$ truncates a data polynomial $\alpha(x)$ to keep only its lowest r terms, $$\mathcal{L}_r a(x) \triangleq a(x) \bmod x^r, \text{ or} \quad (17)$$

$$\mathcal{L}_r [a_{l-1}, a_{l-2}, \ldots, a_1, a_0] \triangleq [a_{r-1}, a_{r-2}, \ldots, a_1, a_0].$$

$U_r$ truncates a data polynomial $\alpha(x)$ to keep its upper terms starting with power $x^r$.

$$\mathcal{U}_r a(x) \triangleq \frac{(a(x) - \mathcal{L}_r a(x))}{x^r} \quad (18)$$

or $$\mathcal{U}[a_{l-1}, a_{l-2}, \ldots, a_1, a_0] \triangleq [a_{l-1}, a_{l-2}, \ldots, a_{r+1}, a_r].$$

For the special case where v=1, let $g_0(x)$ and $g_1(x)$ be generator polynomials of $C_0$ and $C_1$, respectively. Let $\alpha_0(x)$, $\alpha_1(x)$, $a_2(x)$, ..., $a_{m-1}(x)$ be data polynomials, satisfying $\deg(\alpha_0(x)) < k_1$ and $\deg(\alpha_i(x)) < k_0$, $1 \le i < m$.

Firstly, LFSR encoding can be applied to $\alpha_1(x)$, $\alpha_2(x)$, $\alpha_{m-1}(x)$, respectively, with respect to $g_0(x)$, $$\varepsilon(a_i(x), g_0(x)) \to c_i(x) \triangleq [a_i(x), p_i(x)], i = 1, 2, \ldots, m-1. \quad (19)$$

Secondly, LFSR encoding can be applied to a left-aligned summation $$a_0(x) + \sum_{i=1}^{m-1} \mathcal{U}_{r_s-r_o} a_i(x) \text{ with respect to } g_1(x) \quad (20)$$

$$\varepsilon\left(a_0(x) + \sum_{i=1}^{m-1} \mathcal{U}_{r_1-r_o} a_i(x), g_1(x)\right) \to$$

$$c_0^*(x) \triangleq \left[a_0(x) + \sum_{i=1}^{m-1} \mathcal{U}_{r_1-r_o} a_i(x), p_0^*(x)\right].$$

Then, the following $c_0(x)$ is the desired codeword to encode $\alpha_0(x)$, $$c_0(x) \triangleq c_0^*(x) - \sum_{i=1}^{m-1} c_i(x) = \left[a_0(x), p_0^*(x) - \sum_{i=1}^{m-1} \mathcal{L}_{r_1} c_i(x)\right]. \quad (21)$$

It can be easily verified that $c_0(x) \in C_0$, and furthermore, $c_0(x) + \sum_{i=1}^{m-1} c_i(x) = c_0^*(x)$ is a codeword polynomial in $C_1$. FIG. 4 depicts a diagram of this encoding method for the case m=4 and v=1.

The encoding method described above can be extended to the general scenario where v>1. Let $\alpha_0(x)$, $\alpha_1(x)$, $\alpha_2(x)$, $\alpha_{m-1}(x)$ be data polynomials, satisfying $\deg(\alpha_i(x)) < k_{v-i}$, $0 \le i < v$, and $\deg(\alpha_j(x)) < k_0$, $v \le j < m$. Assume that $a_v(x)$, $a_{v+i}(x)$, ..., $a_{m-1}(x)$, are systematically encoded to $c_v(x)$, $c_{v+1}(x)$, ..., $c_{m-1}(x)$, respectively, utilizing the generator polynomial $g_0(x)$.

Systematic codewords, $$c_i(x) \triangleq [\alpha_i(x), p_i(x)](\deg(p_i(x)) < r_{v-i}), i = 0, 1, \ldots,$$

v-1, can be determined satisfying.

$$\begin{cases} c_0(x) & +c_1(x) & +\ldots & +c_{v-1}(x) & \equiv -\sum_{i=v}^{m-1} c_i(x)(\operatorname{mod} g_v(x)) \\ c_0(x) & +\alpha c_1(x) & +\ldots & +\alpha^{v-1} c_{v-1}(x) & \equiv -\sum_{i=v}^{m-1} \alpha^i c_i(x)(\operatorname{mod} g_{v-1}(x)) \\ c_0(x) & +\alpha^2 c_1(x) & +\ldots & +\alpha^{2(v-1)} c_{v-1}(x) & \equiv -\sum_{i=v}^{m-1} \alpha^{2i} c_i(x)(\operatorname{mod} g_{v-2}(x)) \\ \vdots & \vdots & \ddots & \vdots & \vdots \\ c_0(x) & +\alpha^{v-1} c_1(x) & +\ldots & +\alpha^{(v-1)(v-1)} c_{v-1}(x) & \equiv -\sum_{i=v}^{m-1} \alpha^{i(v-1)} c_i(x)(\operatorname{mod} g_v(x)) \end{cases} \quad (22)$$

The solution to (22) can be validated by showing that it must satisfy $c_0, c_1, \ldots, c_{v-1} \in C_0$. Recall that $c_i(x)$, $i=v, v+1, \ldots, m-1$, all divide $g_0(x)$, thus, (22) can be interpreted as follows $$\begin{cases} c_0(x) & +c_1(x) & +\ldots & +c_{v-1}(x) & \equiv 0 & (\operatorname{mod} g_0(x)) \\ c_0(x) & +\alpha c_1(x) & +\ldots & +\alpha^{v-1} c_{v-1}(x) & \equiv 0 & (\operatorname{mod} g_0(x)) \\ c_0(x) & +\alpha^2 c_1(x) & +\ldots & +\alpha^{2(v-1)} c_{v-1}(x) & \equiv 0 & (\operatorname{mod} g_0(x)) \\ & & & \vdots & & \\ c_0(x) & +\alpha^{v-1} c_1(x) & +\ldots & +\alpha^{(v-1)^2} c_{v-1}(x) & \equiv \equiv 0 & (\operatorname{mod} g_0(x)) \end{cases} \quad (23)$$

which is equivalent to $$\begin{bmatrix} 1 & 1 & 1 & \ldots & 1 \\ 1 & \alpha & \alpha^2 & \ldots & \alpha^{v-1} \\ 1 & \alpha^2 & \alpha^4 & \ldots & \alpha^{2(v-1)} \\ \vdots & \vdots & \vdots & \vdots & \vdots \\ 1 & \alpha^{v-1} & \alpha^{2(v-1)} & \ldots & \alpha^{(v-1)^2} \end{bmatrix} \begin{bmatrix} c_0(x) \operatorname{mod} g_0(x) \\ c_1(x) \operatorname{mod} g_0(x) \\ c_2(x) \operatorname{mod} g_0(x) \\ \vdots \\ c_{v-1}(x) \operatorname{mod} g_0(x) \end{bmatrix} = \begin{bmatrix} 0 \\ 0 \\ 0 \\ \vdots \\ 0 \end{bmatrix}. \quad (24)$$

Note that the above matrix is Vandermonde and thus is non-singular. Therefore, $$c_j(x) \equiv 0 (\operatorname{mod} g_0(x)), j=0, 1, 2, \ldots, v-1. \quad (25)$$

Therefore, (22) is a sufficient system to determine the parity polynomials $p_0(x), p_1(x), \ldots, p_{v-1}(x)$. The II-RS code can be first solved where $r_1=r_2=\ldots=r_v$, which effectively reduces (22) to $$\begin{cases} c_0(x) & +c_1(x) & +\ldots & +c_{v-1}(x) & \equiv -\sum_{i=v}^{m-1} c_i(x)(\operatorname{mod} g_1(x)) \\ c_0(x) & +\alpha c_1(x) & +\ldots & +\alpha^{v-1} c_{v-1}(x) & \equiv -\sum_{i=v}^{m-1} \alpha^i c_i(x)(\operatorname{mod} g_1(x)) \\ c_0(x) & +\alpha^2 c_1(x) & +\ldots & +\alpha^{2(v-1)} c_{v-1}(x) & \equiv -\sum_{i=v}^{m-1} \alpha^{2i} c_i(x)(\operatorname{mod} g_1(x)) \\ \vdots & \vdots & \ddots & \vdots & \vdots \\ c_0(x) & +\alpha^{v-1} c_1(x) & +\ldots & +\alpha^{(v-1)(v-1)} c_{v-1}(x) & \equiv -\sum_{i=v}^{m-1} \alpha^{i(v-1)} c_i(x)(\operatorname{mod} g_1(x)) \end{cases} \quad (26)$$

By solving (26), the following result can be obtained:

$$\begin{bmatrix} c_0(x)(\operatorname{mod} g_1(x)) \\ c_1(x)(\operatorname{mod} g_1(x)) \\ \vdots \\ c_{v-1}(x)(\operatorname{mod} g_1(x)) \end{bmatrix} = \Pi \cdot \begin{bmatrix} c_v(x)(\operatorname{mod} g_1(x)) \\ c_{v+1}(x)(\operatorname{mod} g_1(x)) \\ \vdots \\ c_{m-1}(x)(\operatorname{mod} g_1(x)) \end{bmatrix} \quad (27)$$

where the coefficient matrix $\Pi$ is pre-computed:

$$\Pi \stackrel{\Delta}{=} \quad (28)$$

$$-\begin{bmatrix} 1 & 1 & \ldots & 1 \\ 1 & \alpha & \ldots & \alpha^{v-1} \\ 1 & \alpha^2 & \ldots & \alpha^{2(v-1)} \\ \vdots & \vdots & \vdots & \vdots \\ 1 & \alpha^{v-1} & \ldots & \alpha^{(v-1)^2} \end{bmatrix}^{-1} \cdot \begin{bmatrix} 1 & 1 & \ldots & 1 \\ \alpha^v & \alpha^{v+1} & \ldots & \alpha^{m-1} \\ \alpha^{2v} & \alpha^{2(v+1)} & \ldots & \alpha^{2(m-1)} \\ \vdots & \vdots & \vdots & \vdots \\ \alpha^{(v-1)v} & \alpha^{(v-1)(v+1)} & \ldots & \alpha^{(v-1)(m-1)} \end{bmatrix}.$$

Denote by $p_i^*(x)$ the parity polynomial of the message polynomial $\alpha_i(x)$ with respect to $g_1(x)$, i.e., $$\varepsilon(\alpha_i(x), g_1(x)) \rightarrow [\alpha_i(x), p_i^*(x)], i=0, 1, \ldots, v-1, \quad (29)$$

and $p'_j(x)$ the parity polynomial of the truncated message polynomial $U_{r_1-r_0}\alpha_j(x)$, i.e., $$\varepsilon(U_{r_1-r_0}\alpha_j(x), g_1(x)) \rightarrow [U_{r_1-r_0}\alpha_j(x), p'_j(x)], \quad j=v, v+1, \ldots, m-1. \quad (30)$$

As used herein, a message polynomial can be referred to as a data polynominial. Then, the following result can be obtained:

$$c_i(x) \operatorname{mod} g_1(x) = p_i(x) - p_i^*(x), 0 \le i < v, \; c_j(x) \operatorname{mod} g_1(x) = L_{r_1} c_j(x) - p'_j(x), v \le j < m, \quad (31)$$

which leads to re-expressing (27) as follows:

$$\begin{bmatrix} p_0(x) - p_0^*(x) \\ p_1(x) - p_1^*(x) \\ \vdots \\ p_{v-1}(x) - p_{v-1}^*(x) \end{bmatrix} = \Pi \cdot \begin{bmatrix} \mathcal{L}_{r_1} c_v(x) - p_v'(x) \\ \mathcal{L}_{r_1} c_{v+1}(x) - p_{v+1}'(x) \\ \vdots \\ \mathcal{L}_{r_1} c_{m-1}(x) - p_{m-1}'(x) \end{bmatrix}. \quad (32)$$

Consequently, the desired parity polynomials $p_0(x)$, $p_1(x), \ldots, p_{v-1}(x)$ for II-RS encoding are:

$$\begin{bmatrix} p_0(x) \\ p_1(x) \\ \vdots \\ p_{v-1}(x) \end{bmatrix} = \begin{bmatrix} p_0^*(x) \\ p_1^*(x) \\ \vdots \\ p_{v-1}^*(x) \end{bmatrix} - \Pi \cdot \begin{bmatrix} p_v'(x) - \mathcal{L}_{r_1} c_v(x) \\ p_{v+1}'(x) - \mathcal{L}_{r_1} c_{v+1}(x) \\ \vdots \\ p_{m-1}'(x) - \mathcal{L}_{r_1} c_{m-1}(x) \end{bmatrix}. \quad (33)$$

In the general case where $r_1 \leq r_2 \leq \ldots \leq r_v$, the linear system (26) suffices to determine the parity polynomial $p_{v-1}(x)$. Denote by $\Gamma^{(i)}$ the inverse matrix $$\Gamma^{(i)} \triangleq [\Gamma_0^{(i)}, \Gamma_1^{(i)}, \ldots, \Gamma_i^{(i)}]^T \triangleq \begin{bmatrix} 1 & 1 & 1 & \ldots & 1 \\ 1 & \alpha & \alpha^2 & \ldots & \alpha^i \\ \vdots & \vdots & \vdots & \ddots & \vdots \\ 1 & \alpha^i & \alpha^{2i} & \ldots & \alpha^{i^2} \end{bmatrix}^{-1} \quad (34)$$

and by $\Theta^{(i)}$ the matrix $$\Theta^{(i)} \triangleq -\begin{bmatrix} 1 & 1 & 1 & \ldots & 1 \\ \alpha^{i+1} & \alpha^{i+2} & \alpha^{i+3} & \ldots & \alpha^{m-1} \\ \vdots & \vdots & \vdots & \ddots & \vdots \\ \alpha^{(i+1)i} & \alpha^{(i+2)i} & \alpha^{(i+3)i} & \ldots & \alpha^{(m-1)i} \end{bmatrix} \quad (35)$$

for $i=0, 1, 2, \ldots, v-1$. By pre-computing the coefficient vector $$\pi^{(i)} \triangleq \Gamma_i^{(i)} \cdot \Theta^{(i)}, \quad (36)$$

$c_{v-1}(x)$ is explicitly expressed as $$c_{v-1}(x) \equiv \pi^{(v-1)} \cdot [c_v(x), c_{v+1}(x), \ldots, c_{m-1}(x)]^T \pmod{g_1(x)}. \quad (37)$$

Following (31), the desired parity polynomial $p_{v-1}(x)$ is explicitly determined by $$p_{v-1}(x) = p_{v-1}^*(x) - \pi^{(v-1)} \cdot$$

$$[L_{r_1} c_v(x) - p_v'(x), L_{r_1} c_{v+1}(x) - p_{v+1}'(x), \ldots, L_{r_1} c_{m-1}(x) - p_{m-1}'(x)]^T. \quad (38)$$

Upon solving $c_{v-1}(x)$, $c_{v-2}(x)$ can then be determined through the following equation system from reducing (22):

$$\begin{cases} c_0(x) + c_1(x) + \ldots + c_{v-2}(x) \equiv -\sum_{i=v-1}^{m-1} c_i(x) \pmod{g_2(x)} \\ c_0(x) + \alpha c_1(x) + \ldots + \alpha^{(v-2)} c_{v-2}(x) \equiv -\sum_{i=v-1}^{m-1} \alpha^i c_i(x) \pmod{g_2(x)} \\ \vdots \quad \vdots \quad \ddots \quad \vdots \quad \vdots \\ c_0(x) + \alpha^{v-2} c_1(x) + \ldots + \alpha^{(v-2)^2} c_{v-2}(x) \equiv -\sum_{i=v-1}^{m-1} \alpha^{i(v-2)} c_i(x) \pmod{g_2(x)} \end{cases} \quad (39)$$

Subsequently, $c_{v-2}(x)$ can be obtained:

$$c_{v-2}(x) \equiv \pi^{(v-2)} \cdot [c_{v-1}(x), c_v(x), \ldots, c_{m-1}(x)]^T \pmod{g_2(x)} \quad (40)$$

and so on by induction to conclude with the following theorem.

Theorem 5 Given a set of message polynomials $\alpha_i(x)$ ($\deg(\alpha_i(x)) < k_{v-1}$), $i=0, 1, \ldots, v-1$, $\alpha_j(x)(\deg(\alpha_j(x)) < k_0)$, $j=v, v+1, \ldots, m-1$, its systematic encoding toward a codeword polynomial $[c_0(x), c_1(x), \ldots, c_{m-1}(x)]$ in GII-RS([m, v], n) defined in (3) is achieved by (i). generating $c_j(x)$ by applying LFSR encoding to $a_j(x)$ with respect to the first-layer generator polynomial $g_0(x)$, for $j=v, v+1, \ldots, m-1$;

(ii). sequentially determining $c_{v-1}(x), c_{v-2}(x), \ldots, c_1(x), c_0(x)$, in the form of $$c_i(x) \equiv \pi^{(i)} \cdot [c_{i+1}(x), c_{i+2}(x), \ldots, c_{m-1}(x)]^T \pmod{g_{v-i}(x)} \quad (41)$$

for $i=v-1, v-2, \ldots, 1, 0$.

An example systematic encoding method can include the following.

1. Apply LFSR encoding to $\alpha_v(x), \alpha_{v+1}(x), \alpha_{m-1}(x)$, respectively, with respect to $g_0(x)$.

$$\varepsilon(a_i(x), g_0(x)) \to c_i(x) \triangleq [a_i(x), p_i(x)], \quad (42)$$
$$i = v, v+1, \ldots, m-1, \text{ where } \deg(p_i(x)) < r_0, v \leq i < m.$$

2. For $i=v-1, v-2, \ldots, 1, 0$:

(a) Compute message $\alpha_i^*(x)$ $$\alpha_i^*(x) = \alpha_i(x) + \pi^{(i)} \cdot U_{r_{v-i}-r_0}[\alpha_{i+1}(x), \alpha_{i+2}(x), \ldots, \alpha_{m-1}(x)]^T \quad (43)$$

where $\pi^{(i)}$ is defined in (35).

(b) Apply LFSR encoding to $a_i^*(x)$ with respect to $g_{v-i}(x)$ $$\varepsilon(\alpha_i^*(x), g_{v-i}(x)) \to [\alpha_i^*(x), p_i^*(x)]. \quad (44)$$

(c) Determine the parity polynomial $p_i(x)$ associated with $\alpha_i(x)$ $$p_i(x) = p_i^*(x) - \pi^{(i)} \cdot L_{r_{v-i}}[c_{i+1}(x), c_{i+2}(x), \ldots, c_{m-1}(x)]^T. \quad (45)$$

The computational complexity of the encoding method described above can be determined. The LFSR encoding in steps 1 and 2(b) together takes $O(Rmn^2)$ finite field operations, where $R=\Sigma_{i=0}^{m-1} r_i/nm$ denotes the code rate. Steps 2(a) and 2(c) together take $O(vmn)$ finite field operations. By summing them up, the algorithmic complexity is $O(mn(v+Rn))$.

Note that in the encoding method described above, the coeffecient vector $\pi^{(0)}$ is an all-one vector, whereas in previous approaches the coefficient vector may be $\pi^{(0)}=[\alpha^v, \alpha^{2v}, \ldots, \alpha^{(m-1)v}]$.

Although equal length among interleaves is assumed throughout the present disclosure, embodiments are not so limited. Unequal lengths can be used without affecting encoding and decoding in accordance with the present disclosure. Unequal lengths can be beneficial in applications where equal data length must be enforced among all interleaves.

The present disclosure includes apparatuses and methods related to integrated interleaved (II) Reed-Solomon encoding and decoding. A number of methods can include correcting a number of erasures in each of the number of interleaves and in response to unsuccessfully correcting the number of erasures in each of the number of interleaves: computing a number of corrupted nested interleaves, computing a number of higher order syndromes for each of the number of corrupted nested interleaves, and correcting a number of erasures in each of the corrupted nested interleaves. A number of methods can include systematically encoding data corresponding to first-layer interleaves using a first generator polynomial, computing a number of messages corresponding to the number of first-layer interleaves, systematically encoding the messages using a second generator, and computing parity. The messages can be at least partially based on a first truncated portion of the data. The parity can be at least partially based on a second truncated portion of the data.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for correcting erasures in integrated interleaved Reed-Solomon codes, comprising:
    computing a number of first order syndromes for each of a number of interleaves in a redundant array of independent disks (RAID) while excluding locations of erasures from each of the number of interleaves, wherein a quantity of the erasures is equal to a quantity of the computed number of first order syndromes and the quantity of the computed number of first order syndromes is less than a quantity of a total number of valid syndromes;
    independently performing a correction on a number of the erasures in each of the number of interleaves by calculating a magnitude for each of the number of the erasures in each of the number of interleaves from the computed number of first order syndromes; and
    in response to performing the correction unsuccessfully, wherein unsuccessful correction of the number of the erasures indicates that a quantity of the erasures is greater than the quantity of a total number of valid syndromes:
        computing a number of corrupted nested interleaves by neglecting miscorrection in a first-layer interleave of the number of interleaves;
        computing a number of second order syndromes for each of the number of corrupted nested interleaves; and
        correcting a number of erasures in each of the corrupted nested interleaves.

2. The method of claim 1, further comprising updating the second order syndromes in each of the corrupted nested interleaves.

3. The method of claim 1, further comprising transmitting a corrected codeword in response to all of a remaining number of interleaves being corrected.

4. The method of claim 1, wherein the number of the erasures in each of the interleaves is less than or equal to a quantity of parity in each of the number of interleaves.

5. The method of claim 1, further comprising transmitting a corrected codeword in response to the number of the erasures in each of the number of interleaves being zero.

6. The method of claim 1, further comprising transmitting an error without computing the number of second order syndromes for each of the number of interleaves in response to the number of the erasures in any of the number of interleaves exceeding the quantity of parity in a corresponding one of the number of interleaves.

7. The method of claim 1, wherein calculating the magnitude for each of the number of erasures in each of the number of interleaves from the computed first order syndromes for each of the number of interleaves comprises solving a linear equation system.

8. The method of claim 7, wherein solving the linear equation system comprises using a pre-computed erasure locator matrix corresponding to the number of the erasures in each of the number of interleaves.

9. The method of claim 1, further comprising remapping the number of interleaves such that a quantity of erasures in a particular one of the number of interleaves is less than or equal to a quantity of erasures in a subsequent one of the number of interleaves prior to correcting the number of the erasures.

10. A method for integrated interleaved Reed-Solomon encoding, comprising:
    systematically encoding a number of data polynomials corresponding to a number of first-layer interleaves in a redundant array of independent disks (RAID) using a first generator polynomial to generate a first number of codewords corresponding to the number of first-layer interleaves;

computing a number of messages corresponding to the number of first-layer interleaves, wherein the messages are at least partially based on truncated portions of the number of data polynomials;

systematically encoding the number of messages using a second generator polynomial to generate a second number of codewords corresponding to a number of second-layer interleaves;

computing parity corresponding to the number of first-layer interleaves, wherein the parity are at least partially based on truncated portions of the first codewords;

performing a correction on a number of erasures in the number of first-layer interleaves by neglecting a miscorrection in at least one of the first-layer interleaves; and in response to performing the correction unsuccessfully, wherein unsuccessful correction of the number of erasures indicates that a quantity of erasures is greater than a quantity of a total number of valid syndromes associated with the number of first-layer interleaves, computing a number of corrupted nested interleaves.

11. The method of claim 10, wherein systematically encoding the number of data polynomials comprises linear-feedback-shift-register (LF SR) encoding the number of data polynomials.

12. The method of claim 10, wherein systematically encoding the number of messages comprises linear-feedback-shift-register (LFSR) encoding the messages.

13. The method of claim 10, wherein computing the number of messages comprises adding a dot product of a coefficient vector and a transposition of the truncated portions of the number of data polynomials.

14. The method of claim 13, wherein computing the number of messages further comprises using a pre-computed coefficient vector as the coefficient vector.

15. The method of claim 10, wherein computing the parity comprises subtracting a dot product of a coefficient vector and a transposition of the truncated portions of the first codewords from parity of the second codeword.

16. The method of claim 15, wherein computing the parity further comprises using a pre-computed coefficient vector as the coefficient vector.

17. The method of claim 10, wherein computing the number of messages comprises truncating the number of data polynomials to a quantity of terms equal to a quantity of parity corresponding to each of the number of first-layer interleaves, wherein the terms comprise the truncated portions of the number of data polynomials.

18. The method of claim 17, wherein computing the parity comprises truncating the first codewords to a quantity of additional terms, wherein the additional terms comprise the-truncated portions of the first codewords.

19. The method of claim 10, wherein the first generator polynomial is associated with a first minimum distance, $d_1$; and
wherein the second generator polynomial is associated with a second minimum distance, $d_2$, such that $d_2 \geq d_1$.

20. The method of claim 10, further comprising:
computing a different number of messages corresponding to the number of second-layer interleaves, wherein the different number of messages are at least partially based on the truncated portions of the number of data polynomials;

systematically encoding the different number of messages using a third generator polynomial to generate a third number of codewords corresponding to a number of third-layer interleaves; and computing parity corresponding to the number of second-layer interleaves, wherein the parity are at least partially based on the truncated portions of the first codewords.

21. An apparatus for integrated interleaved Reed-Solomon decoding, comprising:
a redundant array of independent disks (RAID), wherein a portion of the independent disks of the RAID comprise first-layer interleaves; and
a decoder coupled to the RAID, and configured to:
compute a number of first order syndromes for the first-layer interleave while excluding locations of erasures from the first-layer interleave;
independently correct a number of the erasures in the first-layer interleave by calculating a magnitude for each of the number of erasures in the first-layer interleave from the computed number of syndromes; and
in response to unsuccessfully correcting the number of the erasures:
compute a number of corrupted nested interleaves by neglecting miscorrection in the first-layer interleave;
compute a number of second order syndromes for each of the number of corrupted nested interleaves; and
correct a number of erasures in each of the corrupted nested interleaves.

22. The apparatus of claim 21, further comprising a controller coupled to the decoder and configured to operate the decoder.

23. The apparatus of claim 22, wherein the decoder is local to the controller.

24. An apparatus for integrated interleaved Reed-Solomon encoding, comprising:
a memory comprising a redundant array of independent disks (RAID), wherein the RAID comprises first-layer interleaves and at least one of the independent disks comprises a second-layer interleave;
a controller coupled to the memory and configured to:
systematically encode data polynomials to the first-layer interleaves using a first generator polynomial to generate first-layer codewords;
truncate the data polynomials to a quantity of a first set of terms of the data polynomials equal to a quantity of parity in the first-layer interleaves;
compute first-layer messages corresponding to the first-layer interleaves at least partially based on the first set of terms;
systematically encode the first-layer messages to the second-layer interleave using a second generator polynomial to generate a second-layer codeword; and
compute first-layer parity corresponding to the first-layer interleaves at least partially based on a second set of terms of the first-layer codewords from truncating the first-layer codewords;
perform a correction on a number of erasures in the first-layer interleaves while excluding locations of erasures from the first-layer interleaves, wherein a quantity of the erasures is less than a quantity of a total number of valid syndromes of the first-layer interleaves; and in response to performing the correction unsuccessfully, wherein unsuccessful correction of the number of erasures indicates that the quantity of the erasures is greater than the quantity of a total number of valid syndromes, compute a number of corrupted nested interleaves by neglecting miscorrection in at least one of the first-layer interleaves.

25. The apparatus of claim 24, wherein at least one of the independent disks comprises a third-layer interleave; and wherein the controller is further configured to:

compute second-layer messages corresponding to the second-layer interleave at least partially based on the first set of terms;

systematically encode the second-layer messages using a third generator polynomial to generate a third-layer codeword corresponding to the third-layer interleave; and compute second-layer parity corresponding to the second-layer interleave at least partially based on the second set of terms.

26. The apparatus of claim 24, further comprising an encoder coupled to the controller and configured to:

systematically encode the data polynomials to the first-layer interleaves using the first generator polynomial to generate the first-layer codewords;

truncate the data polynomials to the quantity of the first set of terms;

compute the first-layer messages;

systematically encode the first-layer messages to the second-layer interleave using the second generator polynomial to generate the second-layer codeword; and compute the first-layer parity.

* * * * *